United States Patent [19]
Kato et al.

[11] Patent Number: 4,912,313
[45] Date of Patent: Mar. 27, 1990

[54] METHOD OF MEASURING SURFACE TOPOGRAPHY BY USING SCANNING ELECTRON MICROSCOPE, AND APPARATUS THEREFOR

[75] Inventors: Makoto Kato, Kawasaki; Koichi Homma; Fuminobu Komura, both of Yokohama; Toshihiro Furuya, Katsuta, all of Japan

[73] Assignee: Hitachi Ltd., Tokyo, Japan

[21] Appl. No.: 275,069

[22] Filed: Nov. 22, 1988

[30] Foreign Application Priority Data

Nov. 27, 1987 [JP] Japan .................................. 62-299332
Dec. 18, 1987 [JP] Japan .................................. 62-320761

[51] Int. Cl.⁴ ............................................. H01J 37/28
[52] U.S. Cl. ..................................... 250/307; 250/310
[58] Field of Search ................................. 250/307, 310

[56] References Cited

U.S. PATENT DOCUMENTS

| 3,597,607 | 8/1971 | Campbell et al. | 250/307 |
| 4,600,539 | 7/1986 | Ichihashi et al. | 250/310 |
| 4,725,730 | 2/1988 | Kato et al. | 250/307 |
| 4,803,357 | 2/1989 | Brust | 250/310 |

FOREIGN PATENT DOCUMENTS

| 15-17999 | 8/1940 | Japan . |
| 56-150303 | 11/1981 | Japan . |
| 62-6112 | 1/1987 | Japan . |

OTHER PUBLICATIONS

Lebiedzik et al., Scanning Electron Microscopy/1975, (Part I), Apr. 1975, pp. 181–187.
Journal of Electron Microscopy, vol. 34, No. 4, pp. 328–337, (1985), "Measurement of Surface Topography Using SEM with Two Secondary Electron Detectors" By Tadao Suganuma.
Japanese Journal of Applied Physics, vol. 27, Aug. 1988, pp. 1508–1515, "Collection Efficiency Calculation in the Weak Electric Field Limit of Scanning Electron Microscopes (SEM) and Its . . . " by Makoto Kato.
"The Scanning Electron Microscope, Part 1, The Instrument", by S. W. Catley, F.R.S., Section 4.5.4, Cambridge University Press, 1972.

Primary Examiner—Jack I. Berman
Attorney, Agent, or Firm—Fay, Sharpe, Beall, Fagan, Minnich & McKee

[57] ABSTRACT

Disclosed is a method and apparatus for measurement of surface topography of a sample by using a scanning electron microscope, in which: secondary electrons released from the sample are detected by detectors which are four or an integral multiple of four in number and which are disposed above the sample to surround the sample; differential coefficients in two directions perpendicularly intersecting each other at the scanning point are obtained from the detected signals; the differential coefficients are successively summing-integrated along the two directions thereby obtaining surface topography of the sample; and at the same time the calculation expression for calculating the surface topography is corrected with the sample table inclined.

18 Claims, 9 Drawing Sheets

F I G. 1
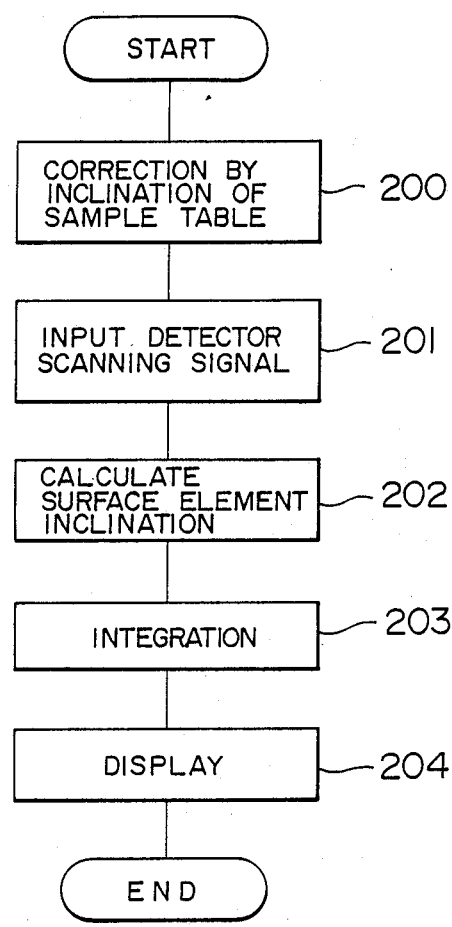

$$\begin{cases} x = r\sin\theta\cos\psi \\ y = r\sin\theta\sin\psi \\ z = r\cos\theta \\ d\Omega = \sin\theta\, d\theta\, d\psi \end{cases}$$

METHOD OF MEASURING SURFACE TOPOGRAPHY BY USING SCANNING ELECTRON MICROSCOPE, AND APPARATUS THEREFOR

BACKGROUND OF THE INVENTION

The present invention relates to a method and apparatus for measurement of surface shape or topography of a finely processed matter or the like, by using a scanning electron microscope (hereinafter simply abbreviated to "SEM"). In particular, the present invention relates to a method and apparatus for measurement of surface topography using an SEM, which is made possible to perform high-accurate measurement by employing a surface topography measurement correcting method in which the result of measurement with respect to a sample on a sample table through the SEM can be corrected only by observing the same sample with the sample table inclined without the necessity of using any specific sample for correction.

Recently, attempts to reproduce surface topography based on the information of image concentration have been extensively carried on. For example, in Japanese Patent Unexamined Publication No. 62-6112 (Japanese Patent Application No. JP-A-60-144434 filed on July 3, 1985 by President of the University of Tokyo), there is disclosed a method for obtaining surface topography by using an SEM with four reflected electron detectors, in which the relation of reflected electron detection outputs and normal lines obtained by use of a reference sample in advance are tabulated, a normal line at each point of the surface of a sample is obtained on the basis of the tabulated relations, and the inclination of the sample surface is integrated on the basis of the information of normal line to obtain the cubic configuration of the surface. On the other hand, in Japanese Patent Unexamined Publication No. 56-150303 (Japanese Patent Application No. JP-A-55-53574 filed on April 24, 1980 by President of the University of Tokyo), Japanese Pat. No. 462,147 (Japanese Patent Publication No. 40-17999, Japanese Publication Application No. JP-A-38-43863 filed on September 13, 1963 by JEOL Ltd.), and Journal of Electron Microscopy vol. 34, No. 4, pp. 328-337, 1985, "Measurement of Surface Topography Using SEM with two Secondary Electron Detectors", Tadao SUGANUMA, there is a method in which two detectors for detecting reflected electrons or secondary electrons are arranged so as to be opposite to each other above a sample, so that the inclination at each point on a virtual line imagined along the sample surface and parallel to a direction connecting the two detectors is obtained on the basis of the experiential fact that the difference in value or in square value between the respective detection outputs obtained from the detectors is approximately proportional to the inclination of the sample surface in the direction connecting the two detectors, thereby obtaining the surface topography on the basis of the information of the inclination.

The method disclosed in the Japanese Patent Unexamined Publication No. 62-6112 has disadvantages in that a large time is required in operation of determining the normal-line direction through comparison between the values of the sample and reference sample, and in that, when the reference sample has a local crack or the like, an error may be caused in the reference signal to thereby affect the result of the measurement directly. Further, there arises a problem in that the calculation expression of inclination is experiential and insufficient in exactness and, in particular, when an inclination component exists in a direction perpendicular to the direction connecting the detectors, the value of inclination becomes inaccurate.

Another method of measurement is discussed in an article by Tadao SUGANUMA, entitled "Measurement of Surface Topography Using SEM with Two Secondary Electron Detectors"; Journal of Electron Microscopy, Vol. 34, No. 4, pp. 328-337, 1985.

In this method, two detectors are provided on an SEM, a difference between the two square values of image signals from the two detectors is obtained so as to obtain an inclination of each pixel on a line in a direction connecting the two detectors, that is, a differential value of the in a direction connecting the two detectors, and the thus obtained differential values with respect to the respective pixels are added successively from the end value so as to be integrated, thereby obtaining surface topography on the line.

In practical use, the calculation expression of the inclination of the sample surface is expressed as follows.

$$\tan\theta = k(A'^2 - B'^2)/(A'_n + B'_n)^2 \qquad (1)$$

In the expression (1), A' and B' represent the values of the output signals of the left and right detectors, and $\theta$ represents the inclination angle of the sample surface.

In the expression (1), the denominator serves to cancel a change in intensity of an incident electron beam, $A'_n$ and $B'_n$ represent the intensity of the output signals of the left and right detectors when an image of a flat portion of the sample is picked up, and k represents a proportion constant which is determined experimentally. In particular, the value of k is obtained from a correction sample formed of a 7 $\mu$m-diameter latex resin ball coated with gold to prevent electrification. By use of the fact that the true value of surface inclination at each point of a sphere can be generally calculated from the relative position on the image of the sphere, the correction of measurement is carried out by comparing the inclination calculated from the image of the correction sample by the expression (1) with the inclination theoretically obtained with respect to the sphere.

In this method, however, it is necessary to prepare a correction sample and to carry out a predetermined correction process, whenever the proportion constant in the expression (1) is changed according to circumstances, such as a change in accelerating voltage, a change in working distance (the distance between an objective lens and a sample), a change in secondary electron pull-in voltage, or the like.

Further, in the case where the measurement condition of a correction sample is not perfectly in accordance with the measurement condition of a sample to be subject to stereo-measurement, there arises a problem that the stereo-measurement is lowered in accuracy.

SUMMARY OF THE INVENTION

A first object of the present invention is to provide a method and apparatus for measurement of surface topography by using an SEM, in which the above problems in the prior art can be solved so that the normal-line direction or inclination of the surface of a sample can be calculated with accuracy in a reduced processing time.

A second object of the invention is to provide a correction method and apparatus for stereo-measurement by using an SEM, in which correction of a stereo-measurement system using an SEM with a plurality of detectors can be made by use of a sample per se to be used as an object to be measured without using any specific correction sample.

The first object of the invention can be attained by a method and apparatus for measurement of surface topography of a sample by using an SEM which serves to scan the sample with a converged electron beam, detect secondary electrons released from the sample corresponding to the surface topography and form image in the image concentration corresponding to the detected signal intensity, the SEM being provided with a plurality (4 or an integral multiple of 4) of detectors attached to the SEM so as to surround the sample so that the surface topography is measured by using the relation between the signals obtained from the detectors and the normal-line direction of the surface of the sample. In short, in the method and apparatus, differential coefficients (in directions parallel to the x-axis and y-axis in a coordinate system containing the sample table) in two directions perpendicularly intersecting the normal-line direction at a point are obtained, and the differential coefficients are successively summing-integrated to thereby measure the surface topography of the sample.

The second object of the invention can be attained by a method and apparatus for correcting the calculation of inclination of the sample surface, in which there are provided means (a sample table inclining mechanism) for desirdly changing the angle between the sample table and the incident electron beam and means (an angle detector) for measuring the angle, whereby the correction is carried out: through a method comprising the steps of obtaining the values of the absolute height from the sample table surface to the sample surface through stereo-processing based on triangular surveying from a displacement between the images before and after the angle is changed with respect to several points, and comparing the obtained values of absolute height with the results of stereo-measurement through a multi-detector method; or through a method for making correction on the calculation of surface inclination of the sample on the basis of two factors, that is, the inclination difference of the sample surface calculated through a multi-detector method from the images before and after the angle between the sample table and the incident electron beam is changed, and the real angle between the sample table and the incident electron beam.

Through the method of surface topography measurement according to the present invention, the normal-line direction or inclination of the sample surface can be obtained exactly in a short processing time. Further, the images of the same sample before and after inclining of the sample table can be formed so that the invention can be applied to a system for measurement of fine three-dimensional topography. Accordingly, even in the case where the expression of calculation of the sampel surface inclination is influenced by circumstances, such as a change in electron beam accelerating voltage, a change in working distance, a change in secondary electron pull-in voltage, and the like, the correction of stereo-measurement can be made by use of the same sample which is a target of measurement without using any specific correction sample.

BRIEF DESCRIPTION OF THE DRAWINGS

Other features and advantages of the present invention will be apparent from the following description taken in connection with the accompanying drawings, wherein:

FIG. 1 is a flow chart of processing in an embodiment of the present invention;

DESCRIPTION OF THE PREFERRED EMBODIMENTS

A method and apparatus for attaining the aforementioned first object of the invention will be described hereunder.

In an SEM, a sample is scanned with a converged electron beam, secondary electrons, reflected electrons and the like, released from the surface of the sample in response of the scanning are detected, and the signal intensity of the result of detection is displayed as an image concentration on a CRT which makes a scanning in synchronism with the scanning of the sample.

It is not sufficient in the viewpoint of accuracy to obtain image concentration and a normal line or surface inclination experimentally in such a manner as in the prior art method. An exact normal line or inclination can be obtained through theoretical analysis applied to the obtained result.

Figure 3:
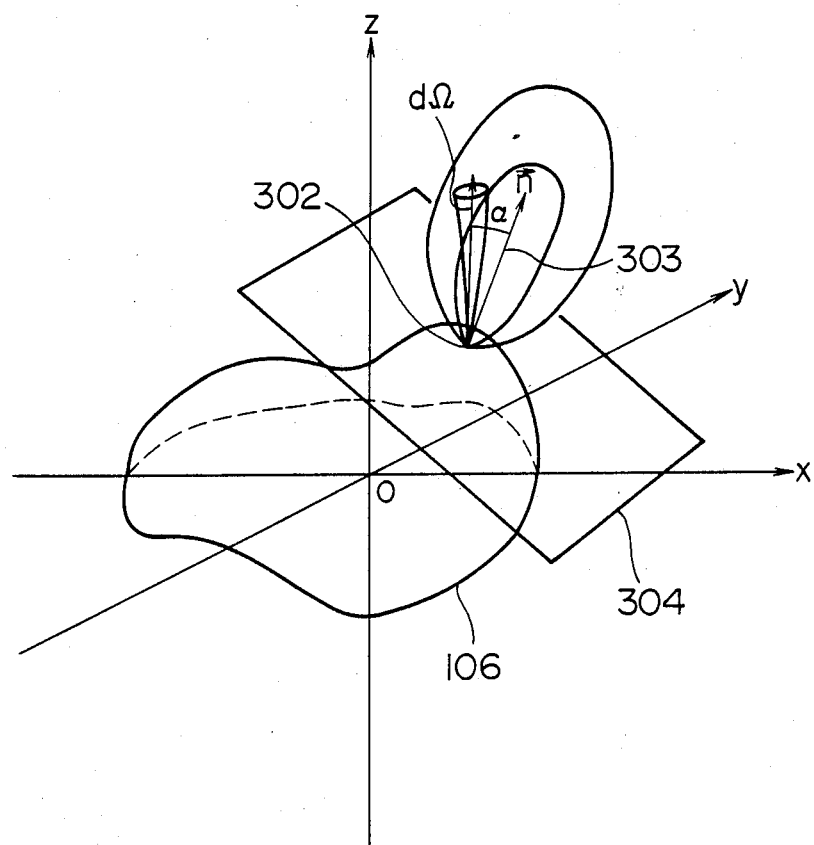
FIG. 3 is a view showing the image forming process of the SEM.

Referring to FIG. 3, the aforementioned secondary electrons are released from a secondary electron releasing point 302 on a sample 106 with intensity according to the "cosine rule" about a normal line 303 represented by $\vec{n}$. In this regard, for example, reference may be made to a book by C. W. OATLEY, F.R.S., "THE SCANNING ELECTRON MICROSCOPE PART 1 THE INSTRUMENT" Cambridge University Press 1972.

Specifically, the number of secondary electrons released within a solid angle $d\Omega$ in the direction apart by an angle $\alpha$ from the normal line is given by the following formula (2):

$$\frac{N}{\pi} \cos \alpha d\Omega \tag{2}$$

where N represents the total number of secondary electrons.

Figure 4:
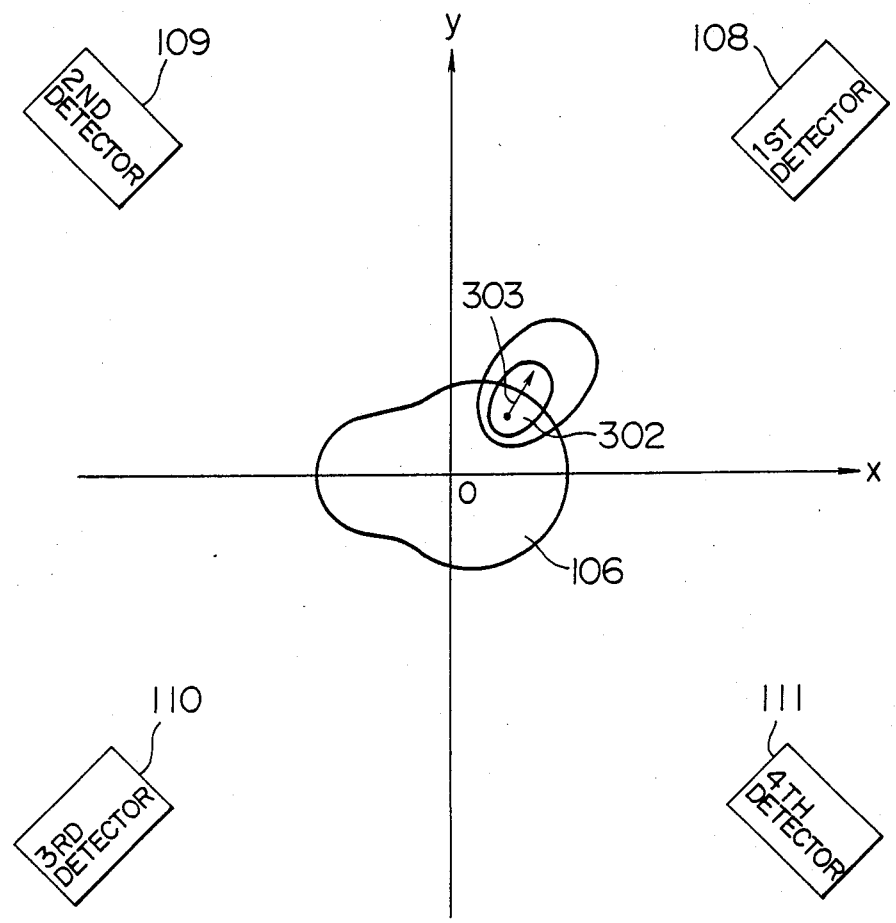
FIG. 4 is a plan view showing a sample and those around the sample.

The secondary electrons are detected by four detectors (a first to a fourth detector) 108 to 111 as shown in FIG. 4. The secondary electrons from the secondary electron releasing point 302 of the sample 106 are, mostly, released to a direction of the normal line 303 but, partly, released to all directions according to the aforementioned cosine rule. In each of the four detectors, an electric field is applied between the detector and the sample to collect secondary electrons. Accordingly, the orbit of the secondary electrons released into the direction of the first quadrant in FIG. 4 is gradually bent due to the electric field, so that the secondary electrons reach the first detector 108 to be detected thereby. In the same manner, the secondary electrons released into the direction of the second quadrant are detected by the second detector 109; the secondary electrons released into the direction of the third quadrant are detected by the third detector 110; and the secondary electrons released into the direction of the fourth quadrant are detected by the fourth detector 111.

With respect to the aforementioned physical model, reference may be made to an article entitled "Collection Efficiency Calculation in the Weak Electric Field Limit of Scanning Electron Microscopes (SEM) and Its Application to SEM Image Generations" Makoto KATO, JAPANESE JOURNAL OF APPLIED PHYSICS VOL. 27, No. 8, AUGUST, 1988, PP. 1508–1515.

From the aforementioned physical model, the signal intensity $I_i$ (i=1, 2, 3, 4) of the i-th detector can be calculated by the following solid angle integration at a solid angle region on a tangential plane 304 as shown in FIG. 3 in each quadrant of the coordinate system of FIG. 4.

$$I_i = \frac{N}{\pi} \int \cos \alpha \, d\Omega, \ (i = 1, 2, 3, 4) \quad (3)$$

Integration range: the solid angle region in the i-th quadrant above the tangential plane.

$\pi$: the ratio of the circumference of a circle to its diameter $\alpha$: the deviation angle from the normal line Although this expression (3) contains the total number N of released secondary electrons, the expression can be finally arranged into an expression which is independent of N. Accordingly, knowledge on N which varies according to the surface inclination angle and other factors is not required.

Here the following three lemmas in a half sphere can be proved mathematically. Because all the normal-line directions are arranged on one half sphere, the relation between the normal line and the image concentration can be used as it is to obtain a normal line of the surface of a general sample.

Lemma 1

In the case of $I_R = I_4 + I_1$ and $I_L = I_2 + I_3$, $I_R/N$ and $I_L/N$ take constant values on a spherical surface line 502 taken on a half-spherical surface 501 and having a constant value of x.

Proof of Lemma 1

$I_R$ is the sum total of secondary electrons released in the positive x-direction and $I_L$ is the sum total of secondary electrons released to in the negative x-direction ($N = I_R + I_L$). On the line 502, the positional relation of the normal line, the tangential plane and the section obtained by cutting a half sphere by the y-z section (or the line 502) does not change if the y-z coordinate system is rotated by a value corresponding to rotation around the x-axis, because the sample is regarded as a half sphere. Accordingly, the solid angle region for integration of the expression (3) does not change with respect to $I_R$ and $I_L$ though it is rotated around the x-axis, and therefore the value of integration of the expression (3) does not change. Accordingly, the releasing ratio of the electrons released in the positive x-direction to those in the negative x-direction does not change, though N changes as the inclination changes. Consequently, $I_R/N$ and $I_L/N$ are constant.

Lemma 2

The following expression f accords with the x-differentiation of the surface of y=0 on the half sphere.

$$f = \frac{I_L - I_R}{2\sqrt{I_L \cdot I_R}} \quad (4)$$

Proof of Lemma 2

Figure 6:
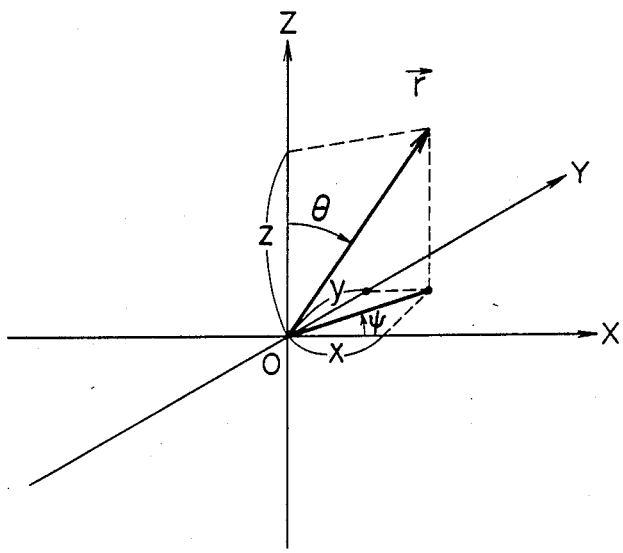
FIG. 6 is a view showing a polar coordinate system.

An ordinary polar coordinate system as shown in FIG. 6 is now considered. In the aforementioned integral expression (3) with respect to $I_R$, the normal line is expressed by $$\vec{n} = (\sin \theta_0, 0, \cos \theta_0)$$

in which $\theta_0$ represents the angle between the Z-axis and the normal line at an arbitrary point on the surface.

Using the expression $d\Omega = \sin \theta \, d\theta \, d\psi$, the specifically expressed integral range is rewritten as follows.

$$I_R = \frac{N}{\pi} \int_{-\frac{\pi}{2}}^{\frac{\pi}{2}} \int_0^{\theta_{max}} \cos\alpha \sin\theta \, d\theta \, d\psi \quad (5)$$

When the vector representing the direction of $(\theta, \psi)$ in the aforementioned Polar coordinate system is expressed by $e = (\sin \theta \cos \psi, \sin \theta \sin \psi, \cos \theta)$, the following expression (6) is obtained.

$$\cos\alpha = \frac{\vec{n} \cdot \vec{e}}{|n||e|} \quad (6)$$
$$= \sin\theta_0 \sin\theta \cos\psi + \cos\theta_0 \cos\theta$$

In the expression (5), $\theta_{max}$ represents the upper limit of the integral range which is determined by the tangential plane. More particularly, $\theta_{max}$ is regarded as $\theta$ of an intersection line of the planes $\vec{n} \cdot \vec{e} = 0$ and $y = (\tan \psi)x$. Assuming $0 \leq \theta_0 < \pi/2$, $\theta_{max}$ is given by the following expressions (7).

$$\sin\theta_{max} = \frac{1}{\sqrt{1 + \cos^2\psi \tan^2\theta_0}} \quad (7)$$

$$\cos\theta_{max} = \frac{\cos\psi \tan\theta_0}{\sqrt{1 + \cos^2\psi \tan^2\theta_0}}$$

The integration is given by the following expression.

$$I_R = \frac{N}{2}(1 + \sin\theta_0)$$

Similarly, the following expression is obtained.

$$I_L = \frac{N}{2}(1 - \sin\theta_0)$$

Accordingly, the x-differentiation, that is, $-\tan\theta_0$ is obtained as follows.

$$x\text{-differentiation }(-\tan\theta_0) = \frac{I_L - I_R}{2\sqrt{I_R \cdot I_L}} \quad (8)$$

Lemma 3

When the x-differentiation $p_0$ at a point A on the x-axis on the half sphere and the y-differentiation $q_0$ at a point B on the y-axis are given in FIG. 5B, the normal line $n=(-p, -q, 1)$ at a point C is determined as follows.

$$p = p_0 \sqrt{\frac{1 + q_0^2}{1 - p_0^2 q_0^2}} \quad (9)$$

$$q = q_0 \sqrt{\frac{1 + p_0^2}{1 - p_0^2 q_0^2}}$$

In the expressions (9), p represents the differential coefficient $\partial z/\partial x$ at the x-axis, and q represents the differential coefficoemt $\partial z/\partial y$ at the y-axis.

Proof of Lemma 3

Considering the expression of a sphere to be $x^2+y^2+z^2=R^2$, the x-differentiation at the point A and the y-differentiation at the point B are respectively given by the following expressions.

$$\frac{\partial z}{\partial x} = -\frac{x}{\sqrt{R^2 - x^2}}$$

$$\frac{\partial z}{\partial y} = -\frac{y}{\sqrt{R^2 - y^2}}$$

Let these expressions be respectively replaced by $p_0$ and $q_0$, then the x-differentiation and y-differentiation at point C are expressed as the expressions (9) using $p_0$ and $q_0$ because they can be represented by the following expressions.

$$p = \frac{\partial z}{\partial x} = -\frac{x}{\sqrt{R^2 - x^2 - y^2}}$$

$$q = \frac{\partial z}{\partial y} = -\frac{y}{\sqrt{R^2 - x^2 - y^2}}$$

Consequently, the expressions of Lemma 3 can be obtained.

Figure 5A:
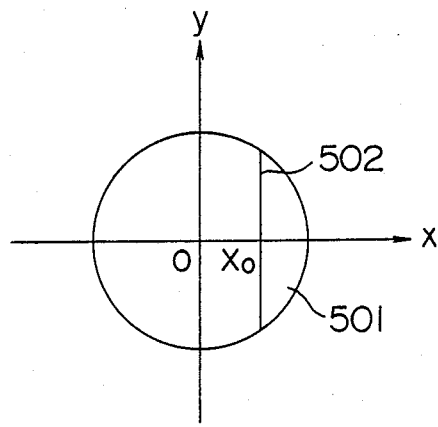
FIGS. 5A and 5B are views showing a coordinate system used to express a half sphere which is put instead of the sample and seen from above.
Figure 5B:
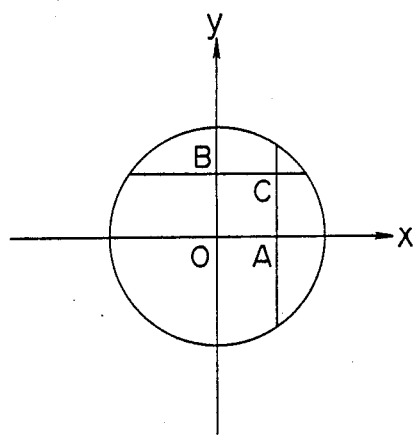

Using the three lemmas, the normal line at the point C in FIG. 5B can be determined from the values of $I_1$, $I_2$, $I_3$ and $I_4$ at the point C. This can be proved as follows.

From Lemma 1, the values of $I_R/N$ and $I_L/N$ at the point A are found. Because the denominator in the expression (4) of Lemma 2 is homogeneous to the numerator with respect to $I_R$ and $I_L$, the x-differentiation at the point A can be obtained. By repetition of the same process as described above using $I_1$ and $I_2$ as a pair and using $I_3$ and $I_4$ as a pair, the y-differentiation at the point B can be obtained.

Here, the object can be attained if Lemma 3 is used.

As the result, p and q which are respectively the x-differentiation and y-differentiation at the point C are given as follows.

$$p = \frac{I_2 + I_3 - I_4 - I_1}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}} \quad (10)$$

$$q = \frac{I_3 + I_4 - I_1 - I_2}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

These are exact theoretical expressions which are different from experimental expressions used in the prior art method.

If the normal line can be obtained, the surface topography can be obtained by successive summing-integration of this information.

When the height, x-differentiation and y-differentiation at the point of $x=i$ and $y=j$ are respectively represented by $z_{ij}$, $p_{ij}$ and $q_{ij}$, the value of $z_{ij}$ can be obtained by use of a reference value $z_{00}$ as follows.

For example, the value of $z_{ij}$ can be represented by the following expression (11) in the case where the inclination of one point is considered.

$$z_{ij} = z_{00} + \sum_{m=0}^{i} p_{m,0} + \sum_{m=0}^{j} q_{i,m} \quad (11)$$

On the other hand, the value of $Z_{ij}$ can be represented by the following expression (12) in the case where the inclinations of two adjacent points are averaged to improve accuracy.

$$z_{ij} = z_{00} + \frac{1}{2}\sum_{m=0}^{i}(p_{m,0} + p_{m+1,0}) + \quad (12)$$

$$\frac{1}{2}\sum_{m=0}^{j}(q_{i,m} + q_{i,m+1})$$

The preferred embodiments of the present invention will be described more in detail with reference to the drawings.

Figure 2:
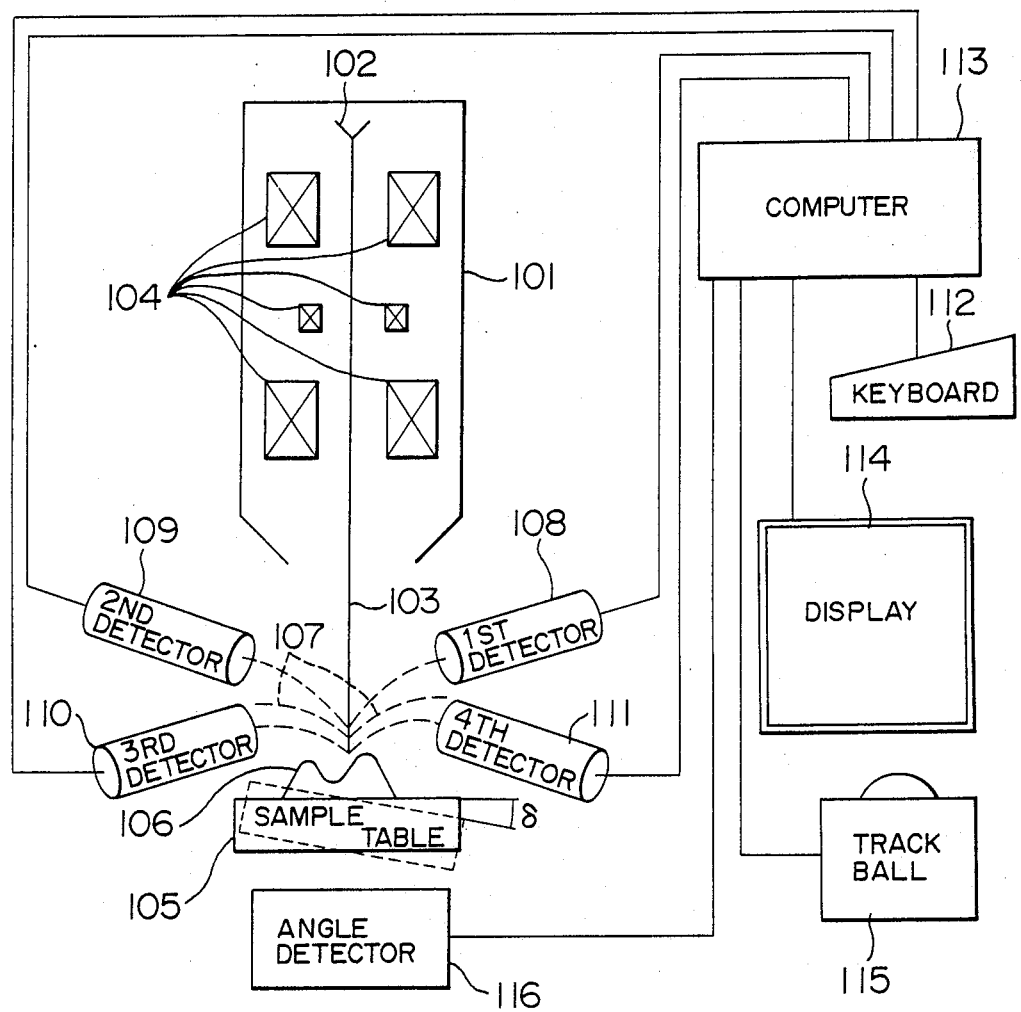
FIG. 2 is a diagram of an apparatus for measurement of surface topography by using an SEM provided with four secondary electron detectors.

FIG. 2 is a diagram showing a hardware structure of an apparatus for measurement of surface topography by using an SEM with four secondary electron detectors, as an embodiment of the present invention. In FIG. 2, an electron beam 103 released from an electron gun 102 of a tube 101 is converged and deflected by an electron lens series 104, so that the electron beam 103 reaches a sample 106 disposed on a sample table 105. In response to the arrival of the electron beam, secondary electrons 107 are released from the sample 106 and then detected by a first detector 108, a second detector 109, a third detector 110 and a fourth detector 111.

The signals from the detectors are processed by a computer which is operated under instructions from a key board 112. The signals per se of the detectors or the results of computation are displayed a display unit 114.

FIG. 1 is a flow chart of a series of process in the embodiment of the present invention. In a step 200, the sample table is inclined to correct the expression of calculation. In a step 201, the scanning signals of the respective detectors are sent to a memory of the computer. In a step 202, the x-direction inclination component of a surface element and the y-direction inclination component of the surface element are calculated from the four signals of the detectors as described above. In this embodiment, the following expressions are used.

$$p = \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}} \quad (13)$$

$$q = \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

In the expressions, $I_1$, $I_2$, $I_3$ and $I_4$ represent the output signals of the detectors 108 to 111, respectively.

In practice, the calculation of p and q is carried out with respect to every point of the surface of the sample through scanning with an electron beam.

The constants $k_1$ and $k_2$ are determined to be the optimum values in the step 200 in accordance with a method of correcting the expression of calculation by making the sample table incline which is the second object of the present invention.

In a step 203, the inclination components calculated in the step 202 are summing-integrated by reference to the center of the CRT image. For example, the summing-integration is performed in accordance with the expression (12).

In a step 204, the result is displayed.

In the following, a method and apparatus to attain the second object of the present invention will be described.

In the case where the coefficients in the expression of calculation of inclination of the surface of the sample are to be corrected, the expression of calculation of inclination is corrected on the basis of the images of the sample and the inclination angles of the sample table before and after the sample table is inclined by a sample table inclining mechanism.

The sample table is constructed so that the inclination angle thereof can be changed around an axis parallel to the y-axis of FIG. 4 as shown by a broken line of FIG. 2.

In general, the signals from the respective detectors at a sample surface point (i,j) are combined as follows. Let the signals from the first, second, third and fourth detectors be $I_1$, $I_2$, $I_3$ and $I_4$, respectively. Let the sum ($I_1+I_4$) of the signals from the first and fourth detectors be replaced by A(i,j). Let the sum ($I_2+I_3$) of the signals from the second and third detectors be replaced by B(i,j), let the sum ($I_1+I_2$) of the signals from the first and second detectors be replaced by C(i,j), and let the sum ($I_3+I_4$) of the signals from the third and fourth detectors be replaced by D(i,j).

The general formula to express inclination can be represented by the following expression.

$$T(i,j) = f\{A(i,j), B(i,j), C(i,j), D(i,j)\} \quad (14)$$

The calculation expression (14) changes according to the observation condition of the SEM and has errors.

Accordingly, the true value of inclination is approximated with the expression:

$$T(i,j) = af\{A(i,j), B(i,j), C(i,j), D(i,j)\} + b \quad (15)$$

in which a and b are values obtained by the correcting process.

In this invention, therefore, an absolute height at a typical point on the image is obtained by a stereo-matching process under the condition that the sample table is inclined, so that correction of the expression (14) is made in comparison between the absolute height and the result of integration of the expression (15).

In the following, the principle of this method is described.

The information of the height of the sample surface is represented by the following expression (16) which corresponds to the expression (17).

$$Z(i,j) = Z_0 + a \sum_{m=0}^{i-1} f\{A(m,j), B(m,j), C(m,j), D(m,j)\} + bi \quad (16)$$

Let the coordinates of the typical point be $(i_e, j_e)$, $e = 1, \ldots, N$, then the unknown values a, b and $z_0$ are determined by a least squares method using the expression (16) and the absolute height $z^s(i_e, j_e)$ given by the inclination of the sample table.

More particularly, the unknown values a, b and $z_0$ are calculated as the solution of the normal expressions (17) and (18).

$$P = \begin{pmatrix} \sum_{m=0}^{i_1-1} f\{A(m,j_1), B(m,j_1), C(m,j_1), D(m,j_1)\} , i_1 , 1 \\ \vdots \\ \sum_{m=0}^{i_N-1} f\{A(m,j_N), B(m,j_N), C(m,j_N), D(m,j_N)\} , i_N , 1 \end{pmatrix} \quad (17)$$

$$Q = \begin{pmatrix} z^s(i_1, j_1) \\ \vdots \\ z^s(i_N, j_N) \end{pmatrix} \quad (18)$$

$$\begin{pmatrix} a \\ b \\ z_0 \end{pmatrix} = [P^t P]^{-1} P^t Q \qquad (19)$$

As another method, the correction may be made through comparison between inclination angles of the sample surface obtained from the images before and after the sample table is inclined.

In the following, the principle of this method will be described.

Let the angle formed between the normal line of the sample surface at the coordinates (i,j) on the image before rotation of the sample table and the z-axis be expressed by $\theta(i,j)$ as the inclination angle $\theta$, let the values of synthetic signal intensity from the four detectors at the coordinates (i,j) before rotation of the sample table be $A^0(i,j)$, $B^0(i,j)$, $C^0(i,j)$ and $D^0(i,j)$, respectively, and let the values of signal intensity after rotation of the sample table by angle $\delta$ be $A^1(i,j)$, $B^1(i,j)$, $C^1(i,j)$ and $D^1(i,j)$, respectively. Then the following expressions (20) and (21) are obtained from the expression (15).

$$\tan \theta(i,j) = af\{A^0(i,j), B^0(i,j), C^0(i,j), D^0(i,j)\} + b \qquad (20)$$

$$\tan \{\theta(i,j) + \delta\} = af\{A^1(i,j), B^1(i,j), C^1(i,j), D^1(i,j)\} + b \qquad (21)$$

When the average values of sample surface inclination angles $$f\{A^0(i,j), B^0(i,j), C^0(i,j), D^0(i,j)\}$$

and $$f\{A^1(i,j), B^1(i,j), C^1(i,j), D^1(i,j)\}$$

obtained from the image with respect to the coordinates (i,j) of different points before and after the rotation of the sample table are represented by $\overline{f^0}$ and $\overline{f^1}$, respectively, and the average value of the sample surface inclination angle is represented by $\theta^0$, the expressions (20) and (21) can be arranged as follows.

$$\tan \theta^0 = a\overline{f^0} + b \qquad (22)$$

$$\tan(\theta^0 + \delta) = a\overline{f^1} + b \qquad (23)$$

Let $\theta^0$ and $\delta$ be near 0, then the following expression (24) can be obtained.

$$a = \delta/(\overline{f^1} - \overline{f^0}) \qquad (24)$$

According to this method, calculation of inclination can be effectively corrected by using the coefficient a, though the coefficient b cannot be obtained.

In the following, one example of the correcting means is described with reference to the drawing.

Figure 10:
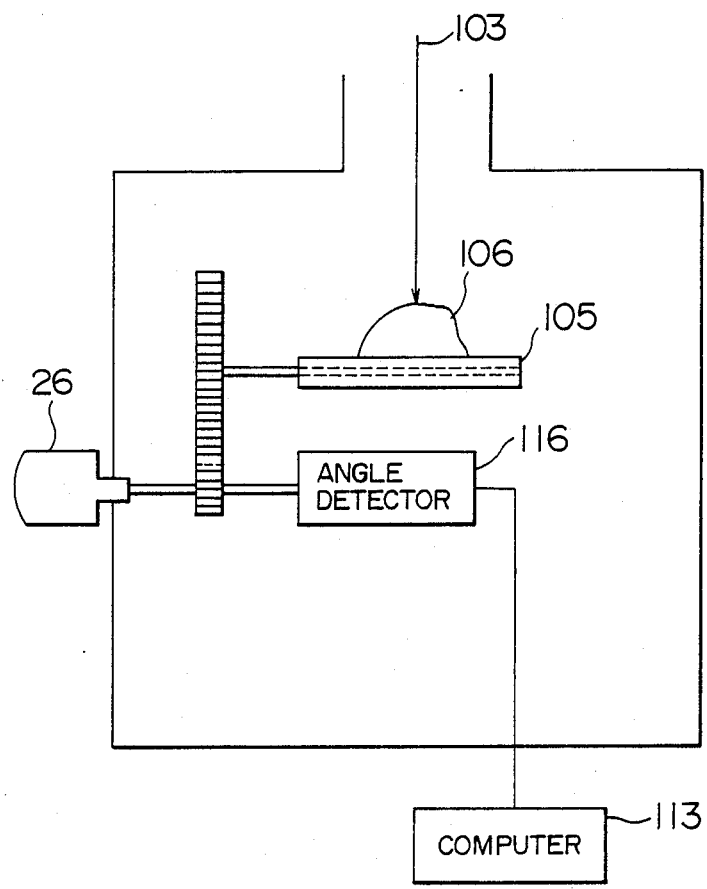
FIG. 10 is a diagram of a sample table inclination mechanism.

As shown in FIG. 10, this sample table inclining mechanism has a knob 26 for giving an inclination to the sample table 105, and an angle detector 116. When a human operator turns the knob 26, the turning of the knob 26 is transmitted to the sample table 105 to incline the sample table 105 at a desired angle. The angle detector 116 detects the rotation angle of the sample table, converts the angle into an electric signal, and then applies the electric signal to the computer 113. The diameter of the gear on the shaft of the knob 26 is smaller than the diameter of the gear on the shaft of the sample table 105. Accordingly, the inclination of the sample table 105 can be adjusted with high accuracy.

The computer 113 calculates the inclination of the sample surface at every point on the image sent from the four detectors with respect to the concentration values, and then integrates the inclination to thereby obtain the surface topography of the sample. Further, in this embodiment, the calculation of inclination of the sample surface is corrected by using the image obtained under the condition that the sample table 105 is not inclined, the image obtained under the condition that the sample table 105 is inclined by the sample table inclining mechanism, and the inclination angle of the sample table 105.

First, the electron beam 103 is applied to the sample under the condition that the sample table 105 is not inclined. As the result, the image signals from the four detectors 108, 109, 110 and 111 are analog-to-digital converted and stored in a memory provided within the computer 113.

Then, image signals are obtained from the same sample 106 again after the sample table 105 is inclined by the sample table inclining mechanism, and then the image signals are stored in the memory of the computer 113.

From these images and the inclination angle of the sample table, the inclination of the sample surface is calculated by the computer 113.

In the following a specific example of the correcting method is described.

Figure 7:
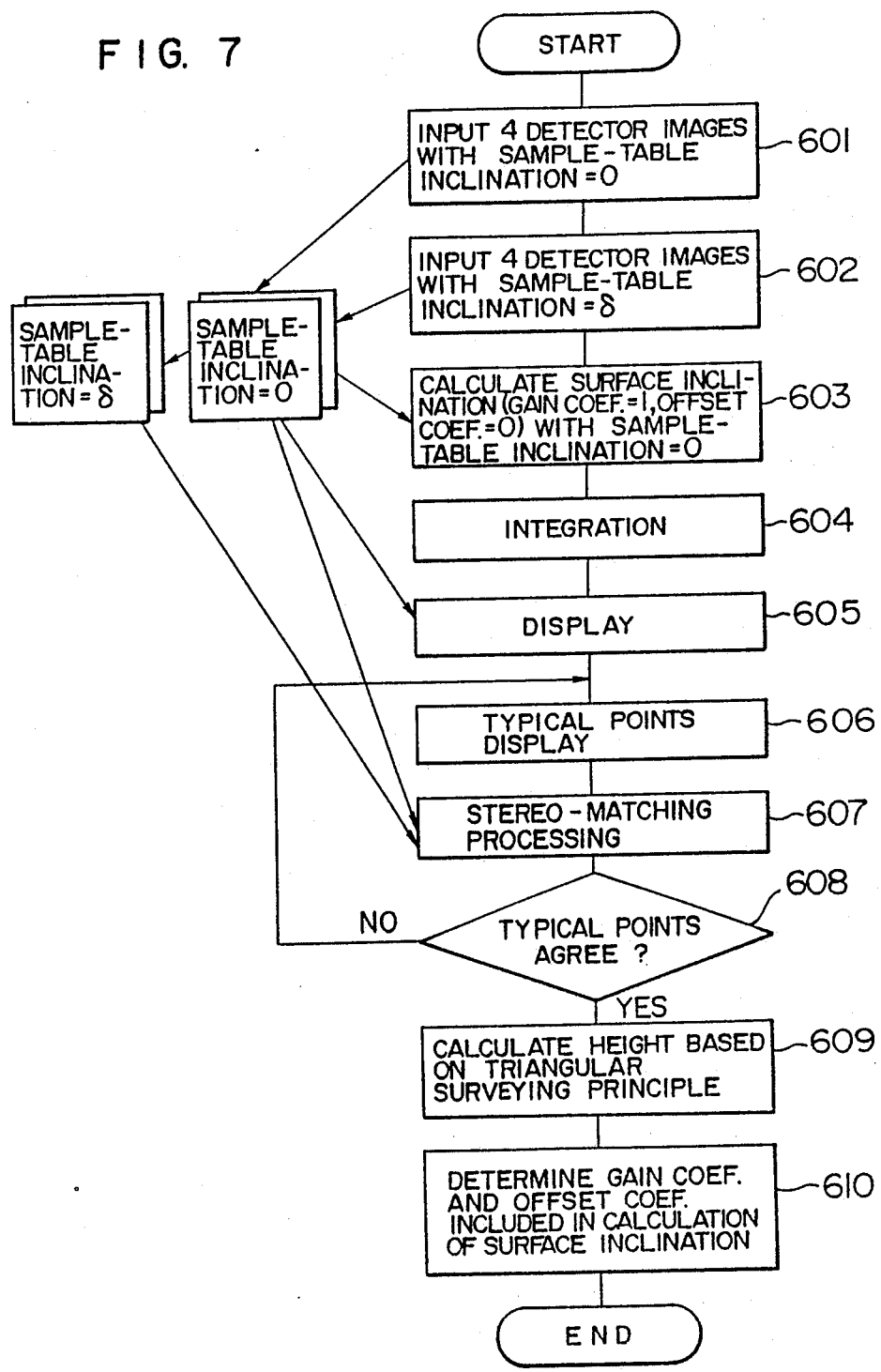
FIG. 7 is a flow chart of a stereo-measurement correcting process by means of stereo-processing in accordance with an embodiment of the present invention.

FIG. 7 is a flow chart for executing the process of stereo-measurement correction through stereo-processing in accordance with an embodiment of the invention.

The processing of this embodiment comprises: means for detecting points corresponding to each other between the images obtained before and after the sample table 105 is inclined; means for calculating the information of height of the corresponding points through stereo-processing by using the inclination angle of the sample table and the coordinates of the corresponding points on the images; and means for correcting the coefficients in the inclination calculation expression so that the surface topography of the sample obtained by summing-integration of differential coefficients can agree with the height information at typical points obtained by the stereo-processing.

The correcting process through the stereo-processing is as follows.

First, the inclination of the sample table is adjusted to be 0 (zero) and, then, an image obtained from the four detectors is taken into the computer (step 601). This image is a mean-concentration image formed on the basis of the intensity of signals which have obtained from the respective detectors, A/D converted and passed through an amplifier. The image has a plane figure similar to that obtained when a sample is observed through an ordinary optical microscope.

Next, an image from the detectors is taken into the computer again after the inclination of the sample table is set to $\delta$ (step 602). The image is a gray scale image similar to the aforementioned image in the case of the step 601.

Next, the four detector images $A^0(i,j)$, $B^0(i,j)$, $C^0(i,j)$ and $D^0(i,j)$ with the sample table inclination set to 0 (zero) are read from the memory, so that pixel inclination at every point of the images is calculated (step 603).

In this embodiment, the following expression (25) which represents the x-direction inclination is used herein instead of the expression (10).

$$p = \frac{\partial z}{\partial x} = \frac{(B-A)}{\sqrt{\frac{3}{4}(A+B+C+D)^2 - 2(C^2+B^2+D^2+A^2)}} \quad (25)$$

In the expression (25), inscription of (i,j) is omitted.

Next, a summing-integration process through the expression (16) is carried out in the conditions of the initial value $z^0=0$, the gain factor $a=1$, and the offset factor $b=0$. The calculation result z(i,j) represents the height of the sample surface.

Next, the calculated value is converted into brightness, for example to make a point which is high in height bright while make a point which is low in height dark, and the image is displayed with the brightness on the image display unit 114. At the same time, the image taken in from the detectors before the sample table is inclined is displayed on the display unit (step 605).

Next, the human operator selects typical points for obtaining absolute height through stereo-processing while watching the displayed images (step 606).

In other words, the human operator selects typical points which can represent portions high and low in height of the sample surface and which are so different in gray scale change as to make it easy to detect the relation between the two images before and after the sample table is inclined. More particularly, several typical points are selected by a track ball 115 from the displayed image with the sample table inclination set zero. The coordinates of the typical points which are N in number are represented by $(i_e, j_e)$ in which $e=1, \ldots, N$.

Next, a stereo-matching process is carried out for the purpose of searching the same point from the images different in viewpoint (step 607). In this process, a calculation is made to select a corresponding point $(i_e', j_e)$ from the image after inclining of the sample table or in other words to minimize the value of the following expression (26).

$$J = \Sigma\{A^1(i_e'+s, j_e+t) - A^0(i_e+s, j_e+t)\}^2 \quad (26)$$

After the typical points are selected (step 608), a height calculating process based on the principle of triangular surveying is carried out by reference to the displacement in the i-direction between the typical point $(i_e, j_e)$ and the corresponding point $(i_e', j_e)$ (step 609). In this case, the y-coordinate is constant because the y-coordinate rotation on a rotation axis parallel to the y-axis.

The principle of triangular surveying of the sample table inclination is as follows.

Assuming that a point $P_1$ having a height z has the coordinate L, then the i-coordinate of the point $P_1$ is changed to $(L \cos \delta - z \sin \delta)$ through the rotation by $\delta$. Further, in order to make sure there is no parallax of the height 0 with respect to the images before and after rotation of the sample table, the i-coordinate after rotation is increased by $1/\cos \delta$ times. Consequently, the i-coordinate of the point $P_1'$ after rotation is converted into $(L-z \tan \delta)$, so that the difference from the i-coordinate L of point $P_1$ before rotation becomes $-z \tan \delta$. Accordingly, in the step 609, the following expression (27) is calculated while $z^s(i_e, j_e)$ is regarded as the absolute height of an e-th typical point.

$$z^s(i_e, j_e) = (i_e - i_e'/\cos \delta)/\tan \delta \quad (27)$$

Lastly, the coefficients a and b and the initial value $z_0$ are calculated through the expression (19) (step 610).

Figure 8:
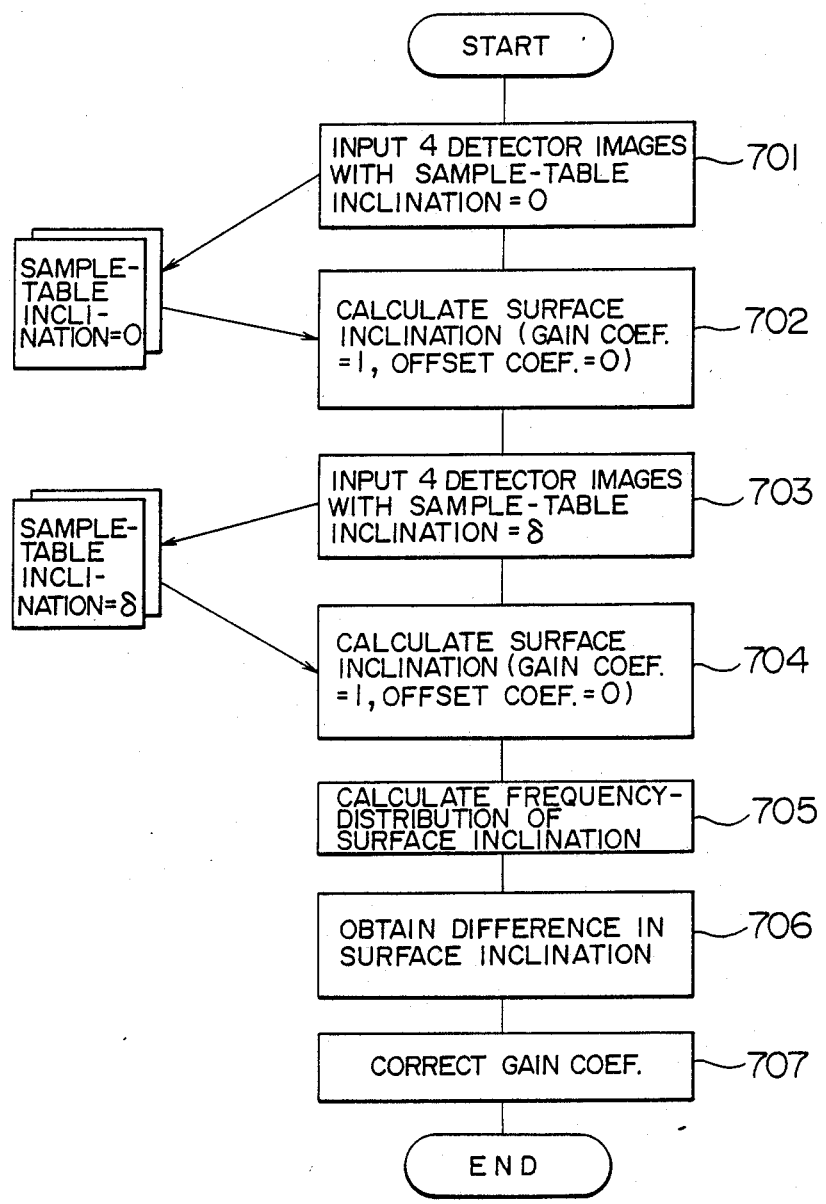
FIG. 8 is a flow chart of a stereo-measurement correcting process by means of inclination-change comparison in accordance with an embodiment of the present invention.
Figure 9:
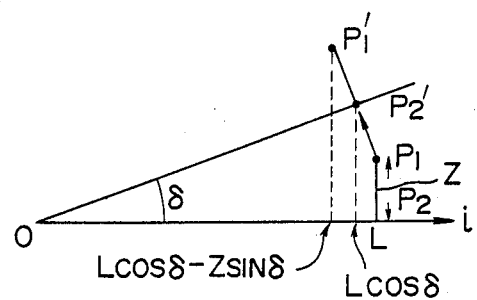
FIG. 9 is a view for explaining the principle of surveying the inclination of the sample table by triangulation.

FIG. 8 is a flow chart for executing the process of stereo-measurement correction through stereo-measurement correction based on the comparison of change in inclination in accordance with another embodiment of the invention.

In this embodiment, the inclination of the sample surface is exactly calculated by means for obtaining two inclinations of the sample surface through the expression (10) from the images obtained before and after inclining of the sample table 105, means for comparing the two inclinations, and means for correcting coefficients in the inclination calculation expression so as to make the difference between the two inclinations agree with the real sample table inclination angle.

The correcting process based on the comparison of inclination change is carried out as follows.

First, the inclination of the sample table is adjusted to be zero. Then images for the four detectors are taken into the computer (step 701), so that inclination $\partial z/\partial x$ is calculated (step 702) by the expression (10).

Next, the images from the four detectors are taken into the computer again (step 703) after rotation of the sample table by $\delta$, so that the inclination $\partial z/\partial x$ is calculated (step 704) through the expression (10) in the same manner as described above.

Next, the frequency distribution of inclination with respect to the image coordinate (i,j) is obtained statistically with respect to each of the images before and after inclining of the sample table (step 705).

Next, the most frequent values $f^0$ and $f_1$ in the frequency distribution are obtained to calculate the difference therebetween (step 706). Based on the results, the gain correction coefficient a in the expression (16) is calculated (step 707) through the expression (24).

Although this embodiment has shown the case where the angle between the sample table and the incident electron beam is changed by inclining the sample table per se, it is to be understood that the invention is not limited to the specific embodiment and that, for example, the same effect can be attained in the case where the incident angle of the electron beam is changed in the apparatus disclosed, for example, in U.S. Pat. No. 4,725,730.

Further, the following expression (28) may be used for obtaining the inclination from the sum $A(i,j) = I_1 + I_4$ of signals from the first and fourth detectors of FIG. 4 and the sum $B(i,j) = I_2 + I_3$ of signals from the second and third detectors.

$$T(i,j) = \{A(i,j) - B(i,j)\}/\{A(i,j) + B(i,j)\} \quad (28)$$

Further, in the case where the system used has merely two (left and right) detectors, the correcting process through the inclination of the sample table can be used without any change, if signals from the two detectors are applied to A and B in the expression (28).

It is to be understood that the present invention is not limited to this embodiment but includes all modifications within the scope of the invention described in the following claims.

We claim:

1. A method for measuring surface topography of a sample by using a scanning electron microscope, which comprises the steps of:

(a) detecting secondary electrons released from said sample by detectors which are four or an integral multiple of four in number and which are disposed above said sample to surround said sample;
(b) obtaining differential coefficients from a mathematical theory on the basis of a characteristic of said secondary electrons released from said sample in two directions perpendicularly intersecting each other at a scanning point of the incident electron beam on the surface of said sample, from detected signals;
(c) summing-integrating said differential coefficients successively along said two directions; and
(d) obtaining surface topography of said sample from the result of said summing-integrating step.

2. A method for measuring surface topography of a sample by using a scanning electron microscope, which comprises the steps of:
(a) detecting secondary electrons released from said sample by detectors which are four or an integral multiple of four in number and which are disposed above said sample to surround said sample;
(b) obtaining differential coefficients from a mathematical theory on the basis of a characteristic of said secondary electrons released from said sample in two directions perpendicularly intersecting each other at a scanning point of the incident electron beam on the surface of said sample, from detected signals;
(c) summing-integrating said differential coefficients successively along said two directions;
(d) obtaining surface topography of said sample from the result of said summing-integrating step;
wherein said detectors are respectively arranged at equal distances in quadrants of a horizontal orthogonal coordinate system having an origin at the center of a sample table so as to detect said secondary electrons, and in which in the case where the number of said detectors is an integral multiple of four, said detectors are divided into four groups which are equal in number and which are disposed in said respective quadrants to detect said secondary electrons.

3. A measuring method according to claim 2, in which the step of obtaining the differential coefficients further includes the steps of:
(a) obtaining the sum of said signals of said detectors in each of said quadrants; and
(b) obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z = h(x,y)$:

$$\frac{\partial z}{\partial x} = \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

$$\frac{\partial z}{\partial y} = \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}.$$

4. An apparatus for measuring surface topography of a sample by using a scanning electron microscope, which comprises:

(a) means for detecting secondary electrons released from said sample by detectors which are four or an integral multiple of four in number and which are disposed above said sample to surround said sample;
(b) means for obtaining differential coefficients from a mathematical theory on the basis of a characteristic of said secondary electrons released from said sample in two directions perpendicularly intersecting each other at a scanning point of the incident electron beam on the surface of said sample from detected signals;
(c) means for summing-integrating said differential coefficients successively along said two directions; and
(d) means for obtaining surface topography of said sample from the result of said summing-integrating step.

5. An apparatus for measuring surface topography of a sample by using a scanning electron microscope, which comprises:
(a) means for detecting secondary electrons released from said sample by detectors which are four or an integral multiple of four in number and which are disposed above said sample to surround said sample;
(b) means for obtaining differential coefficients from a mathematical theory on the basis of a characteristic of said secondary electrons released from said sample in two directions perpendicularly intersecting each other at a scanning point of the incident electron beam on the surface of said sample from detected signals;
(c) means for summing-integrating said differential coefficients successively along said two directions;
(d) means for obtaining surface topography of said sample from a result of said summing-integrating step;
wherein said detectors are respectively arranged at equal distances in quadrants of a horizontal orthogonal coordinate system having an origin at the center of a sample table, and in which, in the case where the number of said detectors is an integral multiple of four, said detectors are divided into four groups which are equal in number and which are disposed in said respective quadrants.

6. A measuring apparatus according to claim 5, in which said means for obtaining the differential coefficients includes:
(a) means for obtaining the sum of said signals of said detectors in each of said quadrants; and
(b) means for obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z = h(x,y)$:

$$\frac{\partial z}{\partial x} = \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

$$\frac{\partial z}{\partial y} = \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}.$$

7. A correcting method for measuring surface topography of a sample by using a scanning electron microscope, which comprises the steps of:
 (a) forming a first image by detecting secondary electrons released from said sample put on a sample table in a condition that said sample table is arranged at an inclination angle of 0°;
 (b) measuring surface topography of said sample from said first image;
 (c) forming a second image by detecting secondary electrons released from said sample in a condition that said sample table is arranged at an inclination angle of δ;
 (d) comparing two positional coordinates of said first image and said second image;
 (e) obtaining a height of said sample above said sample table from said comparison; and
 (f) correcting formulae which represent an inclination of a surface of the sample used in measuring said surface topography so as to make a value representing said height of said sample in said formulae agree with said height obtained in the above step (e).

8. A correcting method according to claim 7, in which the step of measuring said surface topography includes the steps of:
 (a) obtaining the surface inclination of said sample on the basis of information of said first image; and
 (b) measuring said surface topography of said sample by successively summing-integrating said inclination, the step of comparison includes the steps of:

said secondary electrons released from said sample in two directions perpendicularly intersecting each other at a scanning point of the incident electron beam on the surface of said sample, from detected signals;
 (c) summing-integrating said differential coefficients successively along said two directions;
 (d) obtaining surface topography of said sample from the result of said summing integrating step;
wherein said detectors are respectively arranged at equal distances in quadrants of a horizontal orthogonal coordinate system having an origin at the center of a sample table so as to detect said secondary electrons, and in which, in a case where the number of said detectors is an integral multiple of four, said detectors are divided into four groups which are equal in number and which are disposed in said respective quadrants to detect said secondary electrons;
wherein a step of obtaining the differential coefficients further includes the steps of:
 (i) obtaining the sum of said signals of said detectors in each of said quadrants; and
 (ii) obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z = h(x,y)$:

$$\frac{\delta z}{\delta x} \cdot \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}>}}$$

$$\frac{\delta z}{\delta y} \cdot \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}>}}.$$

(c) selecting a plurality of typical points on the image of the measured surface topography;
 (d) detecting points corresponding to said typical points on said second image; and
 (e) comparing positional coordinates of said typical points and said corresponding points on said second image, the step of obtaining said height includes the step of:
 (f) calculating said height by applying the principle of triangular surveying to said typical points and said corresponding points.

9. A correcting method according to claim 8, in which the step of measuring said surface topography includes a method for measuring surface topography of a sample by using a scanning electron microscope, which comprises the steps of:
 (a) detecting secondary electrons released from said sample by detectors which are four or an integral multiple of four in number and which are disposed above said sample to surround said sample;
 (b) obtaining differential coefficients from a mathematical theory on the basis of a characteristic of 10. An apparatus for correcting in measuring surface topography of a sample using a scanning electron microscope, which comprises:
 (a) means for forming a first image by detecting secondary electrons released from said sample put on a sample table in a condition that said sample table is arranged at an inclination angle of 0°;
 (b) means for measuring surface topography of said sample from said first image;
 (c) means for forming a second image by detecting secondary electrons released from said sample in a condition that said sample table is arranged at an inclination angle of δ;
 (d) means for comparing two positional coordinates of said first image and said second image;
 (e) means for obtaining a height of said sample above said sample table on the basis of said comparison; and (f) means for correcting formulae which represent an inclination of a surface of said sample from said height obtained.

11. A correcting apparatus according to claim 10, in which said means for measuring said surface topography includes:

(a) means for obtaining the surface inclination of said sample on the basis of information of said first image; and
(b) means for measuring said surface topography of said sample by successively summing-integrating said inclination, said means for comparison includes:

(c) means for selecting a plurality of typical points on the image of the measured surface topography;
(d) means for detecting points corresponding to said typical points from said second image; and
(e) means for comparing positional coordinates of said typical points and said corresponding points on said second image, said means for obtaining said height includes:

(f) means for calculating said height by applying the principle of triangular surveying to said typical points and said corresponding points.

12. A correcting apparatus according to claim 11, in which said means for measuring said surface topography includes an apparatus for measuring surface topography of a sample by using a scanning electron microscope, which comprises:

(a) means for detecting secondary electrons released from said sample by detectors which are four or an integral multiple of four in number and which are disposed above said sample to surround said sample;
(b) means for obtaining differential coefficients from the mathematical theory on the basis of the characteristic of said secondary electrons released from said sample in two directions perpendicularly intersecting each other at a scanning point of the incident electron beam on the surface of said sample from detected signals;
(c) means for summing-integrating said differential coefficients successively along said two directions; and
(d) means for obtaining surface topography of said sample from a result of said summing-integrating step wherein said detectors are respectively arranged at equal distances in quadrants of a horizontal orthogonal coordinate system having an origin at the center of a sample table, and in which, in the case where the number of said detectors is an integral multiple of four, said detectors are divided into four groups which are equal in number and which are disposed in said respective quadrants wherein said means for obtaining the differential coefficients includes:
(i) means for obtaining a sum of said signals of said detectors in each of said quadrants; and
(ii) means for obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z = h(x,y)$:

$$\frac{\delta z}{\delta x} \cdot \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

$$\frac{\delta z}{\delta y} \cdot \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

13. A correcting method for measuring surface topography of a sample by using a scanning electron microscope, which comprises the steps of:

(a) forming a first image by detecting secondary electrons released from said sample on a sample table arranged at an inclination angle of 0°;
(b) measuring first surface topography of a surface of said sample from said first image;
(c) forming a second image by detecting secondary electrons released from said sample wherein said sample table is arranged at an inclination angle of $\delta$;
(d) measuring second surface topography of said sample on the basis of information of said second image;
(e) obtaining a difference of inclination between specific points corresponding to each other in said first surface topography and said second surface topography;
(f) comparing said difference of inclination with said inclination angle of $\delta$; and
(g) correcting formulae which represent the inclination of the surface used for measurement of said first surface topography on a basis of a result of said comparison.

14. A correcting method according to claim 13, in which the step of measuring said first surface topography includes the steps of:

(a) obtaining a first inclination of the surface of said sample on the basis of information of said first image; and
(b) measuring said first surface topography of said sample by successively summing-integrating said first inclination, the step of measuring said second surface topography includes the steps of:

(c) obtaining a second inclination of the surface of said sample on the basis of information of said second image; and
(d) measuring said second surface topography of said sample by successively summing-integrating said second inclination, the step of obtaining said inclination difference includes the steps of:

(e) obtaining distributions of the frequency of said first inclination and said second inclination in the vicinity of mutually corresponding points in said first surface topography and said second surface topography;
(f) obtaining average values of said distributions of the frequency; and
(g) obtaining a difference between said average value of said first inclination and said average value of said second inclination.

15. The correcting method according to claim 14, in which the steps of measuring said first and second surface topography include:
   (a) detecting secondary electrons released from said sample by detectors which are four or an integral multiple of four in number and which are disposed above said sample to surround said sample;
   (b) obtaining differential coefficients from a mathematical theory on a basis of the characteristic of said secondary electrons released from said sample in two directions perpendicularly intersecting each other at a scanning point of the incident electron beam on the surface of said sample, from detected signals;
   (c) summing-integrating said differential coefficients successively along said two directions;
   (d) obtaining surface topography of said sample from the result of said summing integrating step;
   wherein said detectors are respectively arranged at equal distances in quadrants of a horizontal orthogonal coordinate system having an origin at the center of a sample table so as to detect said secondary electrons, and in which in a case where the number of said detectors is an integral multiple of four, said detectors are divided into four groups which are equal in number and which are disposed in said respective quadrants to detect said secondary electrons;
   wherein the step of obtaining the differential coefficients further includes the steps of:
   (i) obtaining a sum of said signals of said detectors in each of said quadrants; and
   (ii) obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z=h(x,y)$:

$$\frac{\delta z}{\delta x} \cdot \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

$$\frac{\delta z}{\delta y} \cdot \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

16. A correcting apparatus in measuring surface topography of a sample by using a scanning electron microscope, which comprises:
   (a) means for forming a first image by detecting secondary electrons released from said sample on a sample table arranged at an inclination angle of 0°;
   (b) means for measuring first surface topography of said sample from said first image;
   (c) means for forming a second image by detecting secondary electrons released from said sample in a condition that said sample table is arranged at an inclination angle of δ;
   (d) means for measuring second surface topography of said sample on the basis of information of said second image;
   (e) means for obtaining a difference of inclination between specific points corresponding to each other in said first surface topography and second surface topography;
   (f) means for comparing said difference of inclination with said inclination angle of δ; and
   (g) means for correcting a formulae which represent an inclination of a surface of the sample used in measuring said first surface topography on the basis of the result of comparison.

17. A correcting method according to claim 16, in which said means for measuring said first surface topography includes:
   (a) means for obtaining a first inclination of the surface of said sample on the basis of information of said first image; and
   (b) means for measuring said first surface topography of said sample by successively summing-integrating said first inclination,
   said means for measuring said second surface topography includes:
   (c) means for obtaining a second inclination of the surface of said sample on the basis of information of said second image; and
   (d) means for measuring said second surface topography of said sample by successively summing-integrating said second inclination,
   said means for obtaining said difference of inclination includes:
   (e) means for obtaining distributions of the frequency of said first inclination and said second inclination in the vicinity of mutually corresponding points in said first surface topography and said second surface topography;
   (f) means for obtaining average values of said distributions of the frequency; and
   (g) means for obtaining a difference between said average value of said first inclination and said average value of said second inclination.

18. A correcting method according to claim 17, in which the means for measuring said first and second surface topography include an apparatus for measuring surface topography of a sample by using a scanning electron microscope, which comprises:
   (a) means for detecting secondary electrons released from said sample by detectors which are four or an integral multiple of four in number and which are disposed above said sample to surround said sample;
   (b) means for obtaining differential coefficients from a mathematical theory on a basis of a characteristic of said secondary electrons released from said sample in two directions perpendicularly intersecting each other at a scanning point of the incident electron beam on the surface of said sample from detected signals;
   (c) means for summing-integrating said differential coefficients successively along said two directions; and
   (d) means for obtaining surface topography of said sample from a result of said summing-integrating step wherein said detectors are respectively arranged at equal distances in quadrants of a horizontal orthogonal coordinate system having an origin at the center of a sample table, and in which in a case where the number of said detectors is an integral multiple of four, said detectors are divided into four groups which are equal in number and which are disposed in said respective quadrants wherein said means for obtaining the differential coefficients includes:

(i) means for obtaining a sum of said signals of said detectors in each of said quadrants; and (ii) means for obtaining said differential coefficients as the following expressions when the sum of said signals in the first quadrant is represented by $I_1$, the sum of said signals in the second quadrant is represented by $I_2$, the sum of said signals in the third quadrant is represented by $I_3$, the sum of said signals in the fourth quadrant is represented by $I_4$, and the surface expression is represented by $Z=h(x,y)$:

$$\frac{\delta z}{\delta x} \cdot \frac{k_1(I_2 + I_3 - I_4 - I_1)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}$$

$$\frac{\delta z}{\delta y} \cdot \frac{k_2(I_3 + I_4 - I_1 - I_2)}{\sqrt{3(I_2 + I_3 + I_4 + I_1)^2 - 2\{(I_1 + I_2)^2 + (I_2 + I_3)^2 + (I_3 + I_4)^2 + (I_4 + I_1)^2\}}}.$$

* * * * *